United States Patent [19]

Linder

[11] Patent Number: 4,543,540

[45] Date of Patent: Sep. 24, 1985

[54] PHASE LOCKED LOOP WITH LIMITED PHASE CORRECTION WHEN IN LOCKED CONDITION

[75] Inventor: William J. Linder, Plymouth, Minn.

[73] Assignee: Honeywell Inc., Minneapolis, Minn.

[21] Appl. No.: 487,941

[22] Filed: Apr. 25, 1983

[51] Int. Cl.[4] .............................................. H03L 7/00
[52] U.S. Cl. ............................... 331/1 A; 331/DIG. 2
[58] Field of Search .................. 331/1 A, 17, DIG. 2; 328/133; 375/120

[56] References Cited

U.S. PATENT DOCUMENTS

| | | | |
|---|---|---|---|
| 3,755,747 | 8/1973 | Letosky | 328/133 |
| 4,013,840 | 3/1977 | Anderson | 331/1 A X |
| 4,156,855 | 5/1979 | Crowley | 331/1 A |
| 4,320,530 | 3/1982 | Ikeda | 331/1 A X |
| 4,404,530 | 9/1983 | Stryer | 331/17 X |

OTHER PUBLICATIONS

Johnson, H. W. "Detection and Correction of Phase Lock Failure in PLO's", IBM Technical Disclosure Bulletin, v. 14, No. 2 (Jul. 71), p. 580.
Rae, J. W. et al., "Variable Frequency Oscillator Using a Frequency Discriminator", IBM Technical Disclosure Bulletin, v. 27, No. 1 (Jun. 84), pp. 355–357.

Primary Examiner—Eugene R. LaRoche
Assistant Examiner—Robert J. Pascal
Attorney, Agent, or Firm—Theodore F. Neils; David R. Fairbairn

[57] ABSTRACT

A phase locked loop provides limited phase correction when in lock in order to minimize the effects of noise in the periodic input signal to which the loop is locked. The phase locked loop includes a voltage controlled oscillator (VCO), a timing generation divider, a phase detector, a lock detector and an oscillator control circuit. The phase detector provides an output based upon the phase difference between rising edges of the input signal and a loop synthesized signal which is derived by the divider from an oscillator output signal. A window signal, which begins slightly before and ends slightly after an anticipated rising edge of the input signal, is also derived from the oscillator output signal. The lock detector provides a lock detect signal which indicates whether the loop is in lock. The oscillator control circuit provides an oscillator control voltage based upon the phase detector output signal, the window signal, and the lock detect signal. When the loop is in lock, changes to the oscillator control voltage based on the phase detector output are limited by the window signal. When the loop out of lock, full corrections to the oscillator control voltage based upon the phase detector output signal are permitted, so that the loop can rapidly regain the phase locked condition.

13 Claims, 10 Drawing Figures

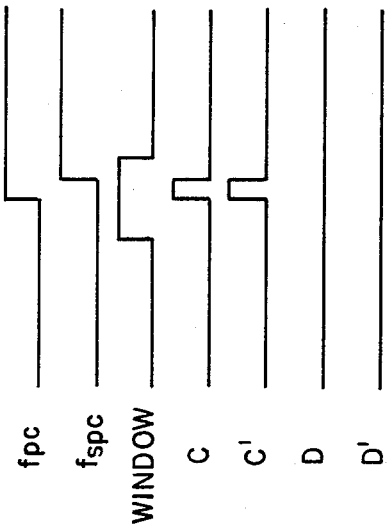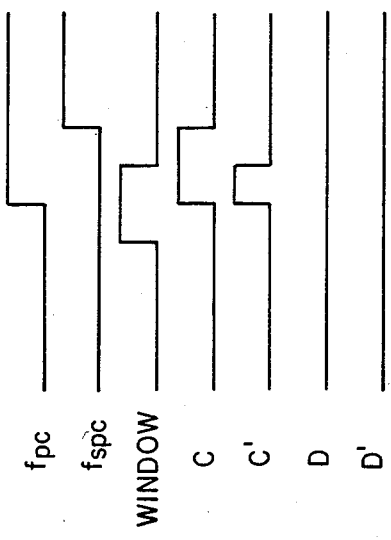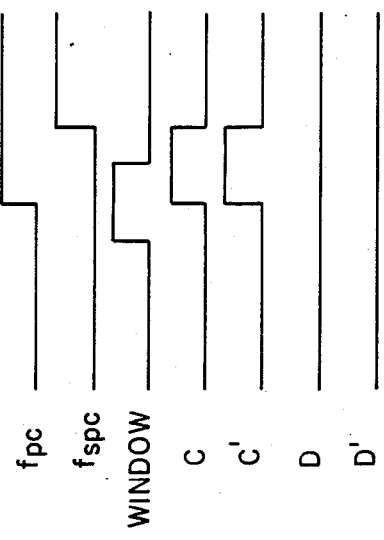

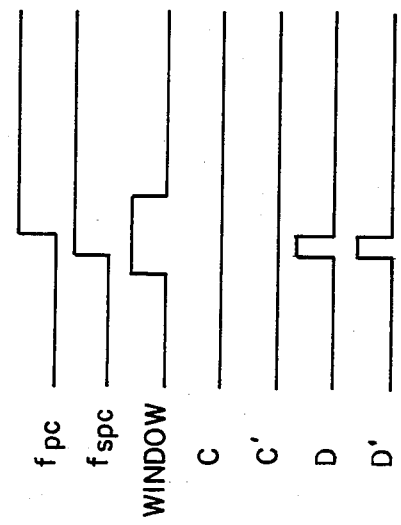
Fig. 5A (LOCK=0)
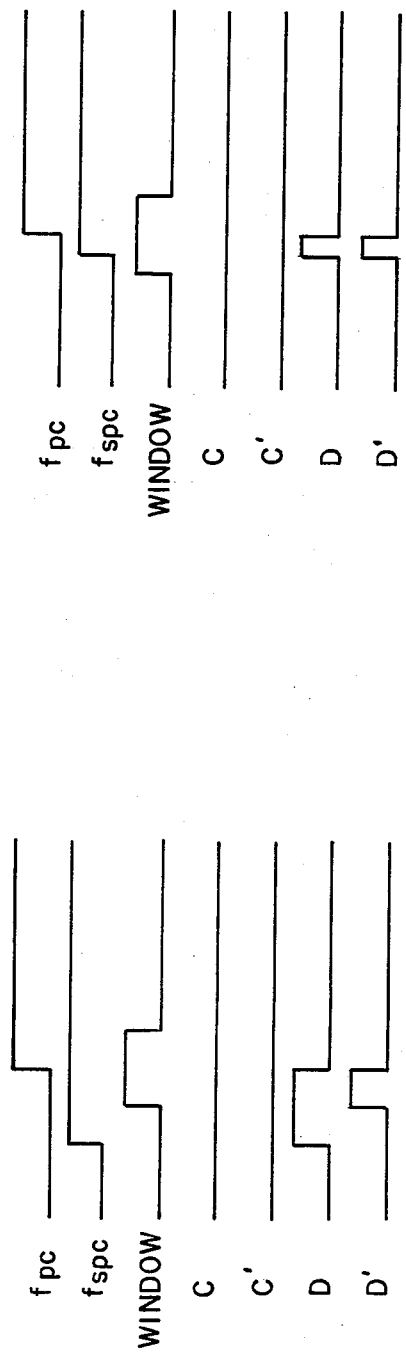
Fig. 5B (LOCK=1)
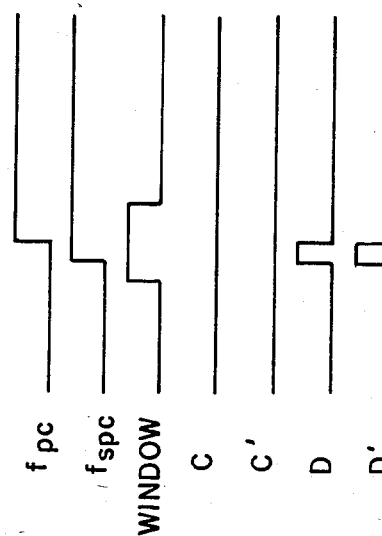
Fig. 6A (LOCK=0)
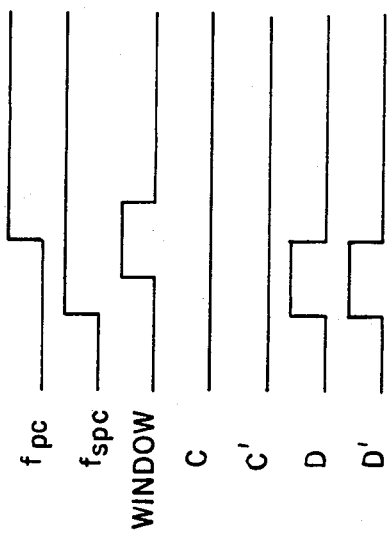
Fig. 6B (LOCK=1)

PHASE LOCKED LOOP WITH LIMITED PHASE CORRECTION WHEN IN LOCKED CONDITION

REFERENCE TO COPENDING APPLICATION

Reference is hereby made to the following copending patent applications which are assigned to the same assignee as the present application:

"System for Preventing Transcient Induced Errors in Phase Locked Loop", G. Kachman, Ser. No. 306,272, filed Sept. 28, 1981 now U.S. Pat. No. 4,389,622.

"Phase Velocity Sign Detector for Frequency Shift Key Demodulation", M. Maas, Ser. No. 404,959, filed Aug. 4, 1982 now U.S. Pat. No. 4,499,425.

"Frequency Shift Key Demodulator", M. Maas and M. Hendrickson, Ser. No. 404,955, filed Aug. 4, 1982 now U.S. Pat. No. 4,486,715.

BACKGROUND OF THE INVENTION

1. Field of the Invention

The present invention relates generally to data communication systems. In particular, the present invention relates to a phase locked loop used in a data communication system which prevents noise contained in an input signal from causing the phase locked loop to be driven out of lock.

2. Description of the Prior Art

In the past, there have been numerous proposals for communications systems which utilize existing power lines to carry the communication signals. One application of this type of communication system is for remote control of appliances and other electrical loads in homes and commercial buildings.

The power line carrier systems normally use a radio frequency (RF) signal which is superimposed with the power line frequency (typically 60 Hz in the United States). The particular data transmission format for the RF signal can take one of several well-known formats.

One advantageous digital data transmission format is frequency shift keyed (FSK) transmission. An FSK transmitter modulates a reference frequency signal based upon the data to be transmitted, so that the transmitted signal has a frequency ($f_{FSK}$) which is either slightly greater than or slightly less than the frequency ($f_O$) of the reference signal. In typical FSK transmission systems, a frequency $f_{FSK}$ which is greater than $f_O$ represents a digital "1" while a frequency $f_{FSK}$ which is less than $f_O$ represents a digital "0". An FSK receiver receives and demodulates the transmitted FSK signal to produce a serial data stream at a predetermined data rate (or "baud rate"). Each bit of the data stream is based upon the frequency of the FSK signal during one bit time period.

In the prior art, FSK receivers have often been quite complicated and required expensive high precision components. The cost and complexity of FSK transmission systems has, as a result, limited the applicability of FSK transmitters and receivers in power line carrier communication systems.

One advantageous power line carrier communication system reduces the need for high precision components by synchronizing the FSK signal, the data rate, and all timing signals used by the transmitter and the receiver with the power line carrier frequency. This is achieved by means of a phase locked loop in the transmitter or receiver which locks onto the power line carrier frequency. The phase locked loop includes a voltage controlled oscillator (VCO) which generates an output signal having a frequency at least as high as $f_O$. The frequency of the VCO output signal is divided to produce all of the timing signals used by the transmitter or receiver, as well as a loop synthesized signal which has the same frequency as the power line frequency when the loop is in lock. A digital tristate phase detector or "sequential" phase detector compares the power line frequency and the synthesized signal, and produces an output signal which is related to the phase difference between the two signals. The phase detector is triggered by rising edges of the two signals. The output of the phase detector is supplied to a loop filter, which produces an oscillator control voltage which determines the frequency of the output of the VCO. The loop seeks a phase locked condition in which the rising edges (e.g. positive zero crossings) of the power line frequency and the loop synthesized signal are synchronous. As a result, the VCO output signal and all of the timing signals derived from the VCO output signal by the timing generation divider circuit are also locked to zero crossings of the power line frequency.

The tristate phase detector used in this communication system is particularly advantageous because it is a simple and easily implemented digital integrated circuit, and because it provides high gain with very small phase errors. On the other hand, the appearance of spurious rising edges (created by noise on the power line) created unwanted digital states which can drive the phase locked loop out of lock. Since the typical power line is prone to various transients and other electrical noise, the adverse effect of noise on the tristate phase detector presents a significant disadvantage to the use of a phase locked loop in this type of a communication system.

One possible solution to the problem of noise is to filter the power line frequency signal before it is applied to the tristate phase detector. This filtering, however, can produce a phase shift which can affect the proper operation of the phase locked loop. In addition, such filters normally require discrete components which increase the cost and thus negate some of the advantages which are otherwise achieved by using a digital tristate phase detector.

Another solution to the noise sensitivity of the phase locked loop is proposed in the previously-mentioned U.S. Pat. No. 4,389,622 to G. Kachman. In this patent application, control circuitry is added to vary the bandwidth of the loop, depending upon whether the phase locked loop is in lock or out of lock. This is achieved by the addition of a lock detector which compares the power line frequency input signal and the loop synthesized signal and produces an output which indicates whether the loop is in lock. The timing generation divider also produces a "window" signal which begins shortly before the anticipated rising edge of the power line frequency input signal and ends slightly after the expected transition. Digital blanking logic controls the application of the power line frequency input signal to the input of the tristate phase detector. When the loop is out of lock, all signal transitions of the input signal are supplied to the input of the phase detector. Once the phase locked loop is in lock, as indicated by the lock detector, the blanking logic edits the power line frequency input signal so that only those transitions which occur during the time period defined by the window signal are applied to the input of the phase detector. Spurious rising edges of the input signal outside of the window are ignored, i.e. they are not permitted to pass to the input of the phase detector. While this system is very effective in reducing the effects of noise on the proper operation of the phase locked loop, there are certain instances in which second order loop error effects are produced due to the editing of the input signal transitions. There is a continuing need, therefore, for an improved system which eliminates the problems of noise in the input to a phase locked loop having a digital tristate phase detector.

SUMMARY OF THE INVENTION

The present invention is an improved phase locked loop which provides a variable bandwidth depending upon whether the loop is in lock our or of lock, and thus minimizes the effects of input signal noise on the proper operation of the phase locked loop. In the phase locked loop of the present invention, the amount of phase correction permitted as a result of a detected phase difference is varied depending upon whether or not the loop is in a phase locked condition ("in lock"). If the loop not in the phase locked condition (i.e. "out of lock"), the entire phase correction is applied. When the loop is in lock, however, the amount of phase correction is limited, so that the effect of noise in the input signal is reduced.

The phase locked loop of the present invention preferably includes phase detector means, oscillator means, means for deriving a periodic loop synthesized signal and a periodic window signal from an oscillator output signal, lock detector means, and oscillator control means for providing an oscillator control signal. The phase detector means provides a phase detector output which is a function of the phase difference between selected signal transitions of a input signal and the loop synthesized signal.

The oscillator output signal has a frequency which is higher than the input signal and which is a function of the oscillator control signal. The loop synthesized signal and the loop window signal are derived from the oscillator output signal. When the phase locked loop is in lock, the input signal and the loop synthesized signal have the same frequency. The window signal has a time duration which begins before and ends after each anticipated signal transition of the input signal. The lock detector means provides a lock detect signal which indicates whether the loop is in lock.

The oscillator control means provides the oscillator control signal as a function of the phase detector output, the window signal, and the lock detect signal. Changes to the oscillator control signal based upon the phase detector output are limited by the window signal when the lock detect signal indicates that the loop is in lock. On the other hand, when the lock detect signal indicates that the loop is out of lock, changes to the oscillator control signal based upon the phase detector output are not limited by the window signal. As a result, only relatively small changes to the oscillator control signal (and thus only relatively small changes to the frequency of the oscillator output signal) are permitted while the phase locked loop is in lock. When the loop is out of lock, on the other hand, relatively large changes to the oscillator control signal based upon the phase detector output are permitted. This allows the phase locked loop to rapidly regain the in lock condition whenever the loop is out of lock.

BRIEF DESCRIPTION OF THE DRAWINGS

FIGS. 3A and 3B, 4A and 4B, 5A and 5B, and 6A and 6B are waveforms which illustrate the operation of the correction limiting logic shown in FIG. 2 under four different phase detector output conditions when the phase locked loop is in lock and out of lock.

DETAILED DESCRIPTION OF THE PREFERRED EMBODIMENTS

Although the present invention is applicable to various types of systems in which noise in an input signal may disrupt proper operation of a phase locked loop, the present invention is particularly advantageous in a power line carrier data communication system. For that reason, the following description of the phase locked loop of the present invention will be the context of a transceiver 10 of a power line carrier FSK data system in which data is communicated to and from transceiver 10 using an existing alternating current (AC) power line 12 instead of using special wiring between transceiver 10 and another similar transceiver (not shown).

Figure 1:
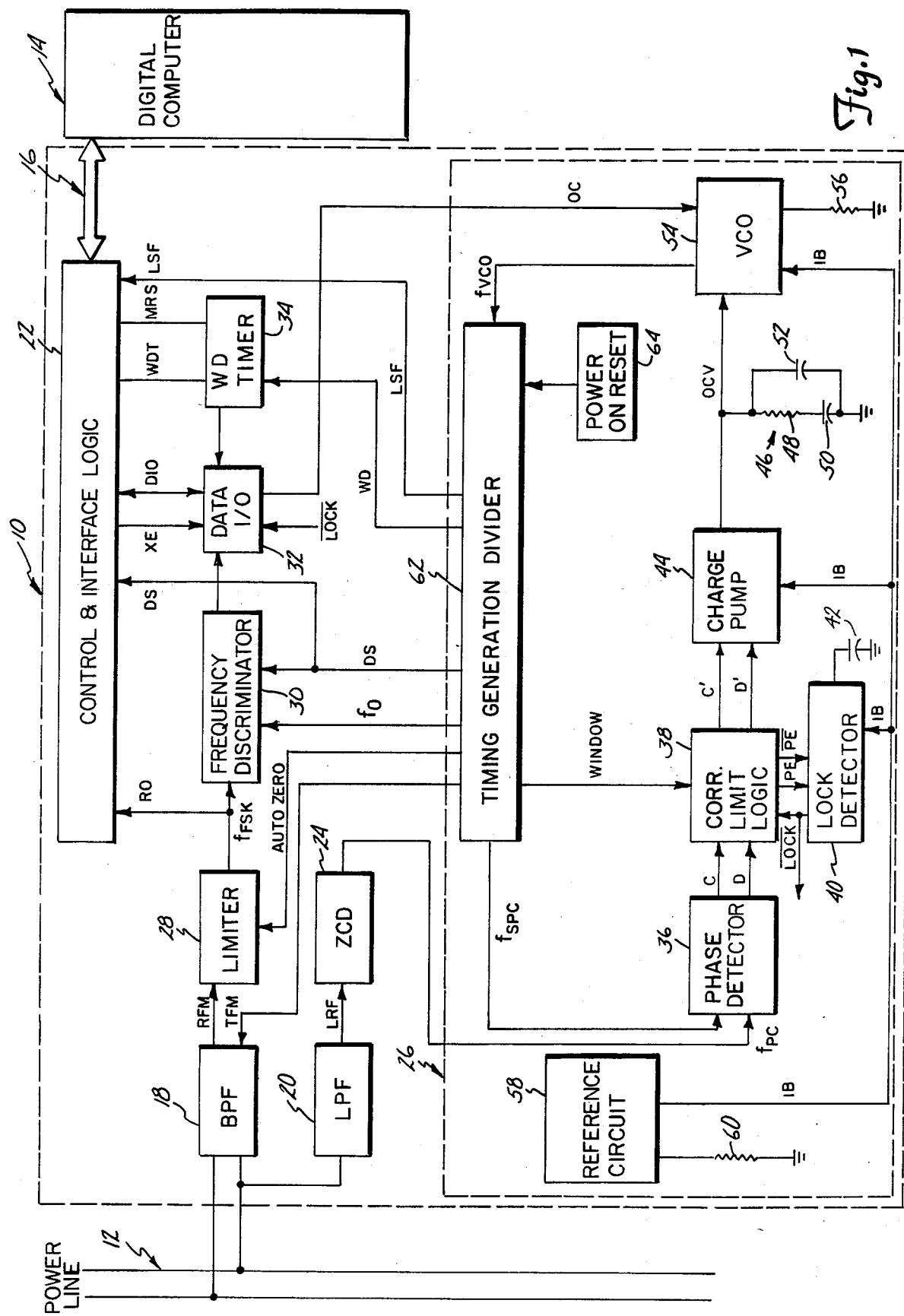
FIG. 1 is an electrical block diagram of a power line carrier FSK communication system utilizing the improved phase locked loop of the present invention.

In the particular embodiment shown in FIG. 1, the data to be transmitted by transceiver 10 is received from digital computer 14 via communication link 16, such as an RS232C serial full duplex asynchronous communication interface cable using ASCII characters. Transceiver 10 converts the ASCII character demands from digital computer 14 to a power line communication code, and transmits that code in the form of serial FSK signal to power line 12.

When transceiver 10 receives an FSK data transmission from power line 12, the FSK signals are received, demodulated and decoded by transceiver 10. The decoded transmission is converted to an ASCII response, and is provided to digital computer 14 through communication link 16.

The FSK signals which are transmitted to and from transceiver 10 on power line 12 have a frequency $f_{FSK}$ which is greater than a reference frequency $f_O$ to represent a binary "1", and which is less than the reference frequency $f_O$ to represent a binary "0". The FSK signal is synthesized from (and therefore synchronized to) the frequency $f_{PC}$ of the electrical power on power line 12. In the United States, frequency $f_{PC}$ is typically 60 Hz. The data rate of the data transmitted to and from transceiver 10 is also preferably based upon a timing signal synthesized from the power line frequency $f_{PC}$. As a result, coherent data transmission through power line 12 is achieved, since all critical frequencies and timing signals are synchronized to power line frequency $f_{PC}$, which acts as a common reference for all transceivers.

Transceiver 10 includes band pass filter 18, low pass filter 20, control and interface logic 22, zero crossing detector 24, phase locked loop 26, limiter 28, frequency discriminator 30, data I/O port 32, and watchdog timer 34.

Band pass filter 18 and low pass filter 20 form a signal conditioning circuit which provides an interface between power line 12 and the remaining circuitry of transceiver 10. Band pass filter 18 passes frequency $f_{FSK}$, while low pass filter 20 passes frequency $f_{PC}$.

When transceiver 10 is in a "receive" mode, the received FSK signal from power line 12 is provided by band pass filter 18 as the RFM input signal to limiter 28. When transceiver 10 is in a "transmit" mode, the TFM output signal generated by phase locked loop 26 is supplied to band pass filter 18, where it is passed on to power line 12 as the transmitted FSK signal. During both the "receive" and the "transmit" modes, low pass filter 20 supplies a sinusoidal LRF signal having frequency $f_{PC}$ from power line 12 to zero crossing detector 24.

Zero crossing detector 24 produces a square wave signal having a frequency $f_{PC}$. Each leading or rising edge of the square wave signal from zero crossing detector 24 corresponds to an upward zero crossing by the sinusoidal LRF signal received from low pass filter 20.

Phase locked loop 16 locks onto frequency $f_{PC}$ and generates all of the timing signals required for operation of transceiver 10. These signals include the reference frequency $f_O$ (which is used by frequency discriminator 30 during the "receive" mode); the TFM signal of frequency $f_{FSK}$ (which is supplied to band pass filter 18 during the "transmit" mode); an AUTO ZERO signal provided to limiter 28; a DATA STROBE (DS) signal provided to frequency discriminator 30 and to control and interface logic 22; a WD signal provided to watchdog timer 34; and a LSF signal provided to control and interface logic 22. In addition, phase locked loop 26 provides a $\overline{LOCK}$ signal to data I/O port 32 which indicates whether phase locked loop 26 is in lock or out of lock. When phase locked loop 26 is out of lock, data I/O port 32 is disabled from providing a control (OC) signal to phase locked loop 26. As a result, transceiver 10 is prevented from operating in the "transmit" mode when phase locked loop 26 is out of lock.

When transceiver 10 is in the "transmit" mode, data I/O port 32 receives a transmit enable (XE) signal from control and interface logic 22. The data to be transmitted is received through line DIO by data I/O port 32, which then provides the OC signal to phase locked loop 26. The OC signal causes phase locked loop 26 to temporarily speed up or slow down, so that the frequency $f_{FSK}$ of the TFM signal supplied to bandpass filter 18 is either slightly greater or slightly less than frequency $f_O$. In a preferred embodiment, the data to be transmitted is in the form of a code which includes equal numbers of "1's" and 0's" and in which there are no long consecutive strings of "1's" or "0's". As a result, phase locked loop 26 is caused to speed up exactly half of the time and slow down exactly half of the time that it is transmitting. The average oscillator control voltage of phase locked loop 26 remains constant, so that phase locked loop 26 is not pulled out of lock.

A received FSK signal from power line 12 is supplied by band pass filter 18 as the RFM signal to limiter 28, which amplifies and squares the RFM signal to produce a square wave signal having frequency $f_{FSK}$. The output of limiter 28 is provided to frequency discriminator 30, and is also provided on the RO line to control and interface logic 22. The presence of a signal on the RO line indicates to control and interface logic 22 that there is an FSK signal already present on power line 12. This functions, therefore, as a "busy signal" to prevent more than one transceiver from attempting to transmit on power line 12 at the same time.

Frequency discriminator 30 compares frequency $f_{FSK}$ from limiter 28 with the reference frequency $f_O$ from phase locked loop 26. In a preferred embodiment, frequency discriminator 30 is of the type described in the previously mentioned patents entitled "Phase Velocity Sign Detector for Frequency Shift Key Demodulation" to M. Maas, U.S. Pat. No. 4,499,425, and "Frequency Shift Key Demodulator" to M. Maas and M. Hendrickson, U.S. Pat. No. 4,486,715.

The output of frequency discriminator 30 is data in the form of a "1" or a "0", depending upon the relationship between $f_{FSK}$ and $f_O$. During the "receive" mode, data I/O port 32 receives the data from frequency discriminator 30 and supplies the data on the DIO line. The data rate at which frequency discriminator 30 generates the data is determined by the DS signal from phase locked loop 26.

Each time the DS pulse is generated by phase locked loop 26, it is provided both to frequency discriminator 30 and to control and interface logic 22. The receipt of the DS pulse indicates to control and interface logic 22 that a new data bit from frequency discriminator 30 is present at data I/O port 32. The new data bit at data I/O port 32 is then read through the DIO line.

Watch dog timer 34 is a fault detecting circuit which prevents transceiver 10 from operating in the "transmit" mode if the microcomputer is not functioning properly. Watchdog timer 34 communicates with control and interface logic 22 through the WDT and MRS lines. The timing of the watchdog timer 34 is based upon the WD timing signal received from phase locked loop 26. Watchdog timer 34 requires that control and interface logic 22 reset it within a predetermined time interval. Failure to receive the reset indicates a potential malfunction, and watchdog timer 34 provides a disable signal to data I/O port 32 to prevent transceiver 10 from operating in the "transmit" mode.

The LSF signal supplied to control and interface logic 22 is, in one embodiment, a 120 Hz signal synthesized by phase locked loop 26 and locked to the 60 Hz frequency $f_{PC}$ of the power line. The LSF signal is a timing signal used by control and interface logic 22 in coordinating and synchronizing operation of transceiver 10.

In the preferred embodiment shown in FIG. 1, phase locked loop 26 of the present invention includes phase detector 36, correction limiting logic 38, lock detector 40, integration capacitor 42, charge pump 44, loop filter network 46 (which includes resistor 48 and capacitors 50 and 52), voltage controlled oscillator (VCO) 54, oscillator set resistor 56, reference circuit 58, current set resistor 60, timing generation divider 62, and power on reset circuit 64.

Phase detector 36 is a digital tristate phase detector which compares an input signal of frequency $f_{PC}$ from zero crossing detector 24 with a loop synthesized signal of frequency $f_{SPC}$ from timing generation divider 62. When phase locked loop 60 is in lock, $f_{SPC}$ equals $f_{PC}$, and the phase difference between the $f_{PC}$ input signal and the $f_{SPC}$ loop synthesized signal is zero.

Phase detector 36 provides a "C" or a "D" output pulse, depending upon a phase difference between rising edges of the $f_{PC}$ and $f_{SPC}$ signals. When the rising edge of the $f_{PC}$ signal occurs before the rising edge of the $f_{SPC}$ signal, this indicates that the $f_{SPC}$ signal is lagging, and that VCO 54 should speed up. Phase detector 36 provides the C output pulse which begins with the rising edge of the $f_{PC}$ signal and ends with the rising edge of the $f_{SPC}$ signal.

Conversely, if the rising edge of the $f_{SPC}$ signal occurs prior to the rising edge of the $f_{PC}$ signal, this indicates that VCO 54 should be slowed down. In that case, phase detector 36 provides the D output pulse, which begins with the rising edge of the $f_{SPC}$ signal and ends with the rising edge of the $f_{PC}$ signal.

The C output pulse of phase detector 36 is a command to charge pump 44 to charge loop filter network 46, which increases the oscillator control voltage (OCV) and speeds up VCO 54, thus increasing the loop frequency. The D output pulse, on the other hand, is a command to charge pump 44 to discharge loop filter network 46, which reduces the oscillator control voltage (OCV) and slows down VCO 54, thus reducing the loop frequency. The magnitude of the commanded change in the oscillator control voltage is a function of the duration of the C or D output pulse.

Correction limiting logic 38 receives the C and D output pulses from phase detector 36, and provides the C' and D' pulses to charge pump 44. The relationship between the C and D pulses from phase detector 36 and the C' and D' pulses supplied to charge pump 44 depends upon whether or not phase locked loop 26 is in lock. When loop 26 is out of lock, the C and D signals correspond to the C' and D' signals, respectively. When the loop 26 is in lock, correction limiting logic 38 limits the duration of the C' or D' pulses based upon a WINDOW signal received from timing generation divider 62.

Lock detector 40 provides a $\overline{LOCK}$ signal which is "0" when phase locked loop 26 is in lock and is "1" when loop 26 is out of lock. Lock detector 40 bases the determination of whether loop 26 is in lock or out of lock upon the phase error (PE and $\overline{PE}$) signals from correction limiting logic 38. As will be described in further detail with respect to FIG. 2, the PE and $\overline{PE}$ signals are derived from the C and D output pulses of phase detector 36.

Integration capacitor 42 is connected between lock detector 40 and ground. The size (i.e. the capacitance) of integration capacitor 42 determines how long it takes lock detector 40 to recognize that the phase locked condition has been achieved or has been lost.

Charge pump 44 receives the C' and D' pulses from correction limiting logic 38 and either causes charging (in response to the C' pulse) or discharging (in response to the D' pulse) of loop filter network 46. The oscillator control voltage (OCV) at the input to VCO 54 is increased in response to charging, and is decreased in response to discharging.

VCO 54 produces an oscillator output signal having a frequency $f_{VCO}$ which is a function of the oscillator control voltage (OCV) at its input. The higher the oscillator control voltage OCV, the higher the oscillator output frequency $f_{VCO}$.

Oscillator set resistor 56 is connected between VCO 54 and ground. Resistor 56 sets the gain of VCO 54.

As shown in FIG. 1, reference circuit 58 provides a reference current IB to lock detector 40, charge pump 44, and VCO 54. Current set resistor 60 is connected between reference circuit 58 and ground, and determines the magnitude of reference current IB.

Timing generation divider 62 receives the oscillator output signal $f_{VCO}$ and divides that frequency down in order to generate the various signals required by transceiver 10. These signals include the reference frequency $f_O$ or the TFM signal of frequency $f_{FSK}$ (depending upon whether transceiver 10 is in the "receive" or the "transmit" mode), together with the AUTO ZERO signal, the loop synthesized signal of frequency $f_{SPC}$, the DS signal, the LSF signal, the WD signal, and the WINDOW signal.

Power-on reset circuit 64 provides a reset pulse to timing generation divider 62 when power is first applied to transceiver 10. This resets divider 62 to a known state at the beginning of operation of transceiver 10.

The WINDOW signal from timing generaton divider 62 is used by correction limiting logic 38 to limit the amount of correction provided by charge pump 44 when phase locked loop 26 is in lock. The WINDOW signal provides a time window which starts shortly before and ends shortly after an anticipated zero crossing of the sinusoidal power carrier signal LRF. Further description of generation of the WINDOW signal can be found in the previously mentioned U.S. Pat. No. 4,389,622 which is incorporated by reference.

Figure 2:
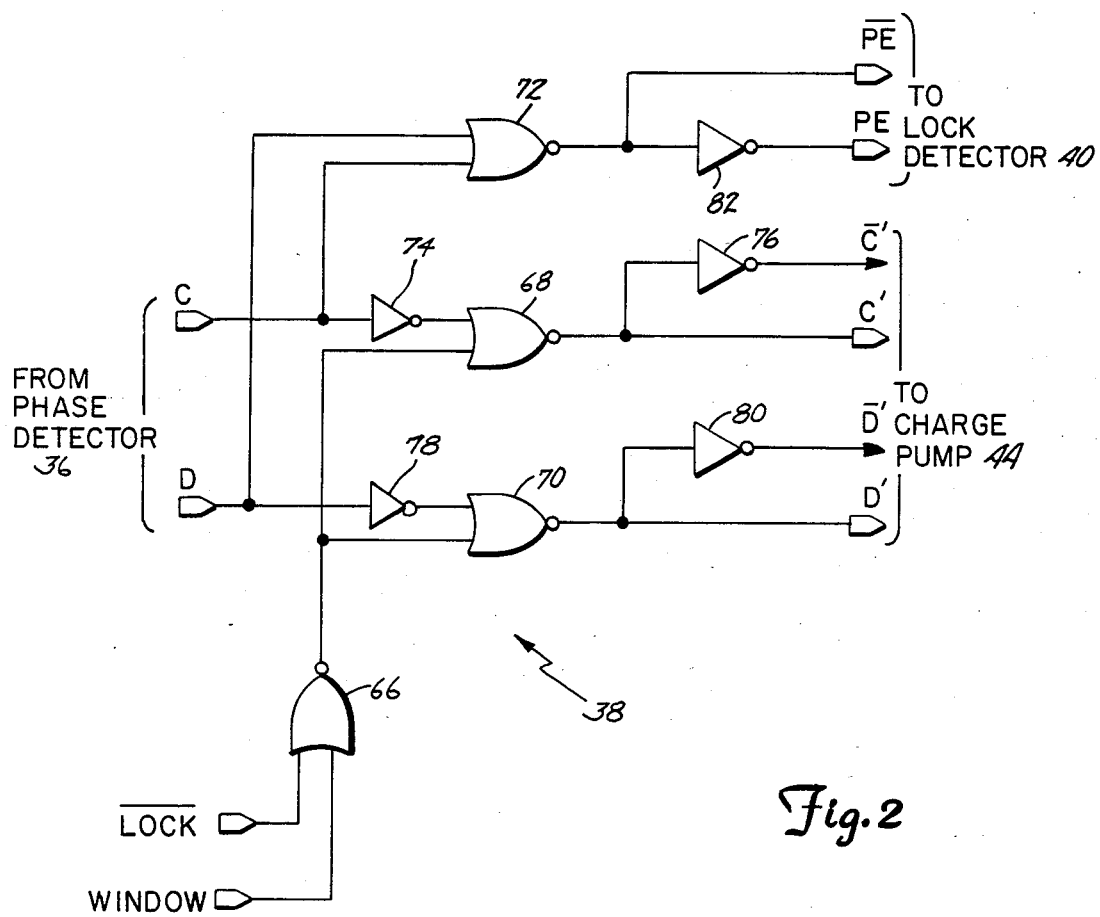
FIG. 2 is an electrical schematic diagram of the correction limiting logic of the phase locked loop of FIG. 1.

FIG. 2 is an electrical schematic diagram of a preferred embodiment of correction limiting logic 38. In this embodiment, logic 38 includes NOR gates 66, 68, 70 and 72 and inverters 74, 76, 78, 80 and 82.

NOR gate 66 receives at its inputs the $\overline{LOCK}$ signal from lock detector 40 and the WINDOW signal from timing generation divider 62. Whenever the $\overline{LOCK}$ signal is a "1" (which indicates that phase locked loop 26 is out of lock), the output of NOR gate 66 is "0", regardless of the state of the WINDOW signal. On the other hand, when the $\overline{LOCK}$ signal is "0" (which indicates that phase locked loop 26 is in lock), the output of NOR gate 66 is "0" only during the time duration of the WINDOW signal pulse. In this embodiment, the WINDOW signal is normally a "0", except during a short time duration which begins slightly before an expected zero crossing of the LRF signal and which ends shortly after the expected zero crossing.

The C output pulse from phase detector 36 is inverted by inverter 74 and supplied to one input of NOR gate 68. The output of NOR gate 66 is supplied to the other input of NOR gate 68. The output of NOR gate 68 is C', which is inverted by inverter 76 to produce the $\overline{C'}$ signal. In one embodiment of the present invention, both the C' and $\overline{C'}$ signals are provided to charge pump 44.

The D output pulse from phase detector 36 is inverted by inverter 78 to one input of NOR gate 70. The output of NOR gate 66 is supplied to the other input of NOR gate 70. The output of NOR gate 70 is the D' signal, which is inverted by inverter 80 to produce the $\overline{D'}$ signal. Both the D' and $\overline{D'}$ signals are preferably provided to charge pump 44.

When loop 26 is out of lock, the output of NOR gate 66 is constantly "0", and therefore the outputs of NOR gates 68 and 70 is controlled solely by the C and D output pulses from phase detector 36, respectively. The pulse durations of the C' and D' signals, therefore, are determined solely by the pulse durations of the C and D signals, respectively.

When the phase locked loop 26 is in lock, the output of NOR gate 66 is "0" only during the pulse duration of the WINDOW signal. As a result, the C' and D' signals are forced to be "0" at all times except during the WINDOW signal pulse. During the WINDOW pulse, the C' or D' signal will be "1" for whatever time period (if any) the C or D signal, respectively, is "1".

The effect of correction limiting logic 38 is to limit the duration of the C' and D' signals to charge pump 44 whenever the $\overline{LOCK}$ signal is "0" (i.e. whenever loop 26 is in lock). This limits the maximum correction to oscillator control voltage OCV whenever loop 26 is in lock. When loop 26 is out of lock, the WINDOW signal is ineffective, and the C' and D' signal pulses have the same duration as the C and D output pulses from phase detector 36. This allows phase locked loop 26 to have maximum corrections needed to achieve lock when it is out of lock.

NOR gate 72 and inverter 82 derive the PE and $\overline{PE}$ phase error signals (which are supplied to lock detector 40) from the C and D pulses. NOR gate 72 receives the C and D output pulses from phase detector 36 at its two inputs. The output of NOR gate 72 is the $\overline{PE}$ signal, which is inverted by inverter 82 to produce the PE signal. The PE signal is "1" whenever either the C or the D pulse is "1". The pulse duration of the PE and $\overline{PE}$ signals, therefore, provides an indication to lock detector 40 of the magnitude of the phase error being detected by phase detector 36. Based upon the PE and $\overline{PE}$ signals, lock detector 40 charges the voltage on integration capacitor 42. That voltage is compared by lock detector 40 to a voltage window to determine the state of the $\overline{LOCK}$ signal.

FIGS. 3A and 3B, 4A and 4B, 5A and 5B, and 6A and 6B illustrate the operation of correction limiting logic 38 of FIG. 2. FIGS. 3A, 4A, 5A and 6A illustrate operation when loop 26 is in lock ($\overline{LOCK}=0$), while FIGS. 3B, 4B, 5B and 6B illustrate operation when loop 26 is out of lock ($\overline{LOCK}=1$).

In FIGS. 3A and 3B, input signal $f_{PC}$ leads loop synthesized signal $f_{SPC}$, so that the output of phase detector 36 is the C pulse which begins with the rising edge of $f_{PC}$ and ends with the rising edge of $f_{SPC}$. In this case, the duration of the C pulse continues after the WINDOW signal pulse has ended. In FIG. 3A ($\overline{LOCK}=0$), the duration of the C' pulse is limited by the WINDOW signal. The C' pulse starts with the rising edge of the C pulse, and ends with the falling edge of the WINDOW signal pulse. In FIG. 3B ($\overline{LOCK}=1$), on the other hand, the C' pulse has a duration which is equal to the duration of the C pulse.

In FIGS. 4A and 4B, $f_{PC}$ again leads $f_{SPC}$, but the phase difference is smaller, so that the C pulse from phase detector 36 occurs entirely within the duration of the WINDOW signal pulse. As a result, the C' pulse has the same duration as the C pulse regardless of whether $\overline{LOCK}=0$ (FIG. 4A) or $\overline{LOCK}=1$ (FIG. 4B).

In FIGS. 5A and 5B, $f_{SPC}$ leads $f_{PC}$, so that phase detector 36 produces a D output pulse which begins with the rising edge of $f_{SPC}$ and ends with the rising edge of $f_{PC}$. In this case, the rising edge of $f_{SPC}$ occurs before the window signal pulse. As a result, when the loop 26 is in lock (FIG. 5A) the D' pulse is limited in duration; it starts with the rising edge of the WINDOW pulse and ends with the falling edge of the D pulse. On the other hand, when the loop 26 is out of lock (FIG. 5B), the D' pulse has the same duration as the D output pulse from phase detector 36.

In FIGS. 6A and 6B, $f_{SPC}$ against leads $f_{PC}$, but the phase difference is much smaller than that shown in FIGS. 5A and 5B. In this case, the D output pulse from phase detector 36 occurs entirely within the time period defined by the WINDOW signal pulse. As a result, the D' pulse is equal in duration to the D pulse from phase detector 36, regardless whether the loop 26 is in lock (FIG. 6A) or out of lock (FIG. 6B).

FIGS. 3A–6B, of course, present only some of the possible variations in the relative locations of the $f_{PC}$ and $f_{SPC}$ rising edges and the WINDOOW pulse. None of the examples, for instance, show a situation where the rising edge of $f_{PC}$ occurs outside the WINDOW pulse. It is clear from the illustrated examples, however, that in each case the C or D pulse begins with one rising edge, and ends with the other, and that the C' and D' pulse duration is limited by the WINDOW pulse if $\overline{LOCK}=0$ and is equal to the C or D pulse duration if $\overline{LOCK}=1$.

The phase locked loop of the present invention has been found to be particularly effective in minimizing the effects of noise contained in the input signal ($f_{PC}$). The phase locked loop 26 of the present invention permits some correction to occur even when a signal transition of either the input signal ($f_{PC}$) or the loop synthesized signal ($f_{SPC}$) occurs outside of the WINDOW pulse, but simply reduces the amount of correction which is permitted if the loop 26 in lock. As a result, the phase locked loop 26 of the present invention has been found to be particularly effective in maintaining phase lock despite the presence of noise in the input signal.

Although the present invention has been described with reference to preferred embodiments, workers skilled in the art will recognize that changes may be made in form and detail without departing from the spirit and scope of the invention.

What is claimed is:

1. A phase locked loop comprising:
   phase detector means for providing a phase detector output which is a function of a phase difference between selected signal transitions of a periodic input signal and a periodic loop synthesized signal;
   oscillator means for providing a periodic oscillator output signal having a frequency which is a function of an oscillator control signal;
   means for deriving the loop synthesized signal from the oscillator output signal;
   means for deriving a periodic window signal from the oscillator output signal, the window signal having a pulse duration which begins before and ends after the selected signal transition of the input signal is anticipated;
   lock detector means for providing a lock detect signal indicative of whether the loop is in lock; and
   means for providing the oscillator control signal as a function of the phase detector output, the window signal, and the lock detect signal, wherein changes to the oscillator control signal based upon the phase detector output are limited by the window signal when the lock detect signal indicates that the loop is in lock, and are not limited by the window signal when the lock detect signal indicates that the loop is out of lock.

2. The phase locked loop of claim 1 wherein the phase detector output includes first and second phase detector output signals, and wherein the oscillator control means changes the oscillator control signal to increase the frequency of the oscillator output signal as a function of the first phase detector output signal, and changes the oscillator control signal to cause a decrease in the frequency of the oscillator output signal as a function of the second phase detector output signal.

3. The phase locked loop of claim 2 wherein the first and second phase detector output signals are pulses having pulse durations which are a function of the magnitude and sign of the phase difference between the the selected signal transitions of the input signal and the loop synthesized signal.

4. The phase locked loop of claim 3 wherein the first phase detector output signal is produced when the selected signal transition of the input signal occurs before the selected signal transition of the loop synthesized signal and wherein the pulse duration of the first phase detector output signal begins with the selected signal transition of the input signal and ends with the selected signal transition of the loop synthesized signal; and wherein the second phase detector output signal is produced when the selected signal transition of the loop synthesized signal occurs prior to the selected signal transition of the input signal, and wherein the pulse duration of the second phase detector output signal begins with the selected signal transition of the loop synthesized signal and ends with the selected signal transition of the input signal.

5. The phase locked loop of claim 4 wherein the means for providing the oscillator control signal to the oscillator means comprises:
means for supplying the oscillator control signal to the oscillator means;
means for changing the magnitude of the oscillator control signal in a first direction to cause an increase in the frequency of the oscillator output signal as a function of a first command signal, and changing the magnitude of the oscillator control signal in a second direction to cause a decrease in the frequency of the oscillator output signal as a function of a second command signal; and
means for producing the first and second command signals as a function of the first and second phase detector output signals, the window signal, and the lock detect signal.

6. The phase locked loop of claim 5 wherein the means for producing the first and second command signals produces the first command signal as a function of the duration of the first phase detector output signal, the window signal, and the lock detect signal and produces the second command signal as a function of the duration of the second phase detector output signal, the window signal and the lock detect signal.

7. The phase locked loop of claim 6 wherein the change in magnitude of the oscillator control signal in the first direction is a function of a pulse duration of the first command signal, and wherein the change in magnitude of the oscillator control signal in the second direction is a function of a pulse duration of the second command signal.

8. The phase locked loop of claim 7 wherein the means for producing the first and second command signals causes the pulse durations of the first and second command signals to be equal to the pulse durations of the first and second phase detector output signals, respectively, when the lock detect signal indicates that the loop is out of lock; and wherein the means for producing the first and second command signals causes the pulse durations of the first and second command signals to be a function of the first and second phase detector output signals, respectively, but limits the pulse durations of the first and second command signals to no greater than the pulse duration of the window signal when the lock detect signal indicates that the loop is in lock.

9. The phase locked loop of claim 1 wherein the lock detect signal is a function of the phase detector output.

10. A phase locked loop comprising:
voltage controlled oscillator (VCO) means for producing an oscillator output signal having a frequency which is function of an oscillator control voltage;
phase detector means for providing a phase detector output as a function of a phase relationship between an input signal and a loop synthesized signal which is derived from the oscillator output signal, the phase detector output indicating that the frequency of the oscillator output signal should be increased if the input signal leads the loop synthesized signal and indicating that the frequency should be decreased if the input signal trails the loop synthesized signal, and further indicating the amount of such an increase or decrease based on the amount of such lead or amount of such trailing;
loop filter capacitor means for storing the oscillator control voltage;
charge pump means for selectively changing the stored oscillator control voltage as a function of charge and discharge command signals;
lock detector means for providing a lock detect signal indicative of whether the loop is in lock based on the amount of the lead or the amount of the trailing indicated in the phase detector output integrated over selected time duration; and
correction limiting means for producing the charge and discharge command signals based upon the phase detector output and the lock detect signal, wherein the amount of change in the oscillator control voltage produced by the charge and discharge signals is limited if the lock detector signal indicates that the loop is in lock.

11. The phase locked loop of claim 10 wherein the phase detector output includes first and second phase detector output signals, the first phase detector output signal being representative of a time duration by which the input signal leads the loop synthesized signal, and the second phase detector output signal being representative of a time duration by which the input signal trails the loop synthesized signal.

12. The phase locked loop of claim 11 wherein the charge command signal has a time duration which is a function of the first phase detector output signal, and wherein the discharge command signal has a duration which is a function of the second phase detector output signal.

13. The phase locked loop of claim 12 and further comprising:
means for deriving a periodic window signal from the oscillator output signal, the window signal having a pulse duration which begins before and ends after an anticipated signal transition of the input signal;
wherein when the lock detect signal indicates that the loop is in lock, the correction limiting means limits the duration of the charge command signal to a time period during which the first phase detector output signal and the window signal are present, and limits the duration of the discharge command signal to a time period during which the second phase detector output signal and the window signal are present; and
wherein when the lock detect signal indicates that the loop is out of lock, the correction limiting means causes the charge and discharge command signals to have durations determined by the first and second phase detector output signals, respectively.

* * * * *